United States Patent
Kung et al.

(10) Patent No.: US 12,036,636 B2
(45) Date of Patent: *Jul. 16, 2024

(54) MEGA-SONIC VIBRATION ASSISTED CHEMICAL MECHANICAL PLANARIZATION

(71) Applicant: Taiwan Semiconductor Manufacturing Co., Ltd., Hsinchu (TW)

(72) Inventors: Chun-Hao Kung, Hsinchu (TW); Shang-Yu Wang, Hsinchu (TW); Ching-Hsiang Tsai, Hsinchu (TW); Hui-Chi Huang, Zhubei (TW); Kei-Wei Chen, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/174,125

(22) Filed: Feb. 24, 2023

(65) Prior Publication Data

US 2023/0219188 A1 Jul. 13, 2023

Related U.S. Application Data

(63) Continuation of application No. 16/516,006, filed on Jul. 18, 2019, now Pat. No. 11,590,627.

(51) Int. Cl.
*B24B 37/10* (2012.01)
*B24B 37/04* (2012.01)
*B24B 37/32* (2012.01)
*H01L 21/3105* (2006.01)
*H01L 21/321* (2006.01)
*H01L 21/768* (2006.01)

(52) U.S. Cl.
CPC .......... *B24B 37/105* (2013.01); *B24B 37/042* (2013.01); *B24B 37/32* (2013.01); *H01L 21/31053* (2013.01); *H01L 21/3212* (2013.01); *H01L 21/7684* (2013.01)

(58) Field of Classification Search
CPC ..... B24B 37/105; B24B 37/042; B24B 37/32; B24B 37/107; H01L 21/31053; H01L 21/3212; H01L 21/7684
USPC .......................................................... 451/41
See application file for complete search history.

(56) References Cited

U.S. PATENT DOCUMENTS

| | | | |
|---|---|---|---|
| 5,101,599 A * | 4/1992 | Takabayasi | B06B 1/0261 451/910 |
| 11,590,627 B2 * | 2/2023 | Kung | B24B 37/042 |
| 2004/0175755 A1 | 9/2004 | Uchida et al. | |
| 2008/0041725 A1 | 2/2008 | Klein et al. | |
| 2009/0057264 A1 | 3/2009 | Mai et al. | |
| 2017/0203406 A1 | 10/2017 | Ganapathiappan et al. | |
| 2018/0005840 A1 | 1/2018 | Liu et al. | |

* cited by examiner

*Primary Examiner* — Tong-Ho Kim
(74) *Attorney, Agent, or Firm* — Slater Matsil, LLP (57) ABSTRACT

A method of performing a chemical mechanical planarization (CMP) process includes holding a wafer by a retainer ring attached to a carrier, pressing the wafer against a first surface of a polishing pad, the polishing pad rotating at a first speed, dispensing a slurry on the first surface of the polishing pad, and generating vibrations at the polishing pad.

20 Claims, 8 Drawing Sheets

MEGA-SONIC VIBRATION ASSISTED CHEMICAL MECHANICAL PLANARIZATION

PRIORITY CLAIM AND CROSS-REFERENCE

This application is a continuation of U.S. patent application Ser. No. 16/516,006, filed on Jul. 18, 2019, and entitled "Mega-Sonic Vibration Assisted Chemical Mechanical Planarization," which application is incorporated herein by reference.

BACKGROUND

Generally, semiconductor devices comprise active components, such as transistors, formed on a substrate. Any number of interconnect layers may be formed over the substrate connecting the active components to each other and to outside devices. The interconnect layers are typically made of low-k dielectric materials comprising metallic trenches/vias.

As the layers of a device are formed, planarization processes may be performed to planarize the layers to facilitate formation of subsequent layers. For example, the formation of metallic features in the substrate or in a metal layer may cause uneven topography. This uneven topography may create difficulties in the formation of subsequent layers. For example, uneven topography may interfere with the photolithographic process commonly used to form various features in a device. Therefore, it may be advantageous to planarize the surface of the device after various features or layers are formed.

Chemical Mechanical Polishing (CMP) is a common practice in the formation of integrated circuits. Typically, CMP is used for the planarization of semiconductor wafers. CMP takes advantage of the synergetic effect of both physical and chemical forces for the polishing of wafers. It is performed by applying a load force to the back of a wafer while the wafer rests on a polishing pad. A polishing pad is placed against the wafer. Both the polishing pad and the wafer are then rotated while a slurry containing both abrasives and reactive chemicals is passed therebetween. CMP is an effective way to achieve global planarization of wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are described with respect to chemical mechanical planarization (CMP) tools and processes, and in particular, CMP tools and processes that use a megasonic generator during the CMP process to generate vibrations at the polishing pad to reduce abrasive aggregation. In some embodiments, patterns of the vibrations, such as the frequency of the vibrations, the amplitude of the vibrations, and/or the duration of the vibrations, are changed during the CMP process to achieve a target wafer polishing profile. As a result of using the disclosed CMP tools and processes, improved planarity and etch rate for the CMP process are achieved. Additional advantage includes reduced polishing pressure used to push the wafer on the polishing pad, which reduces wafer damage.

Chemical mechanical planarization (CMP) is a method of planarizing features produced in the manufacture of semiconductor devices. The process uses an abrasive material in a reactive chemical slurry in conjunction with a polishing pad. The polishing pad typically has a greater diameter than that of the semiconductor wafer. The pad and wafer are pressed together during the CMP process. The process removes material and tends to even out irregular topography, making the wafer flat or substantially planar. This prepares the wafer for the formation of additional overlying circuit elements. For example, chemical mechanical planarization can bring an entire wafer surface within a given depth of field of a photolithography system. Typical depth-of-field specifications are on the order of, e.g., angstroms. In some implementations, chemical mechanical planarization may also be employed to selectively remove material based on its location on the wafer.

In a CMP process, a wafer is placed in a carrier head (also referred to as a carrier), where the wafer is held in place by a retainer ring. The carrier head and the wafer are then rotated as downward pressure is applied to the wafer to press against the polishing pad. A reactive chemical solution is dispensed on a contacting surface of the polishing pad to aid planarization. The surface of a wafer may thus be planarized using a combination of both mechanical and chemical mechanisms.

Figure 1:
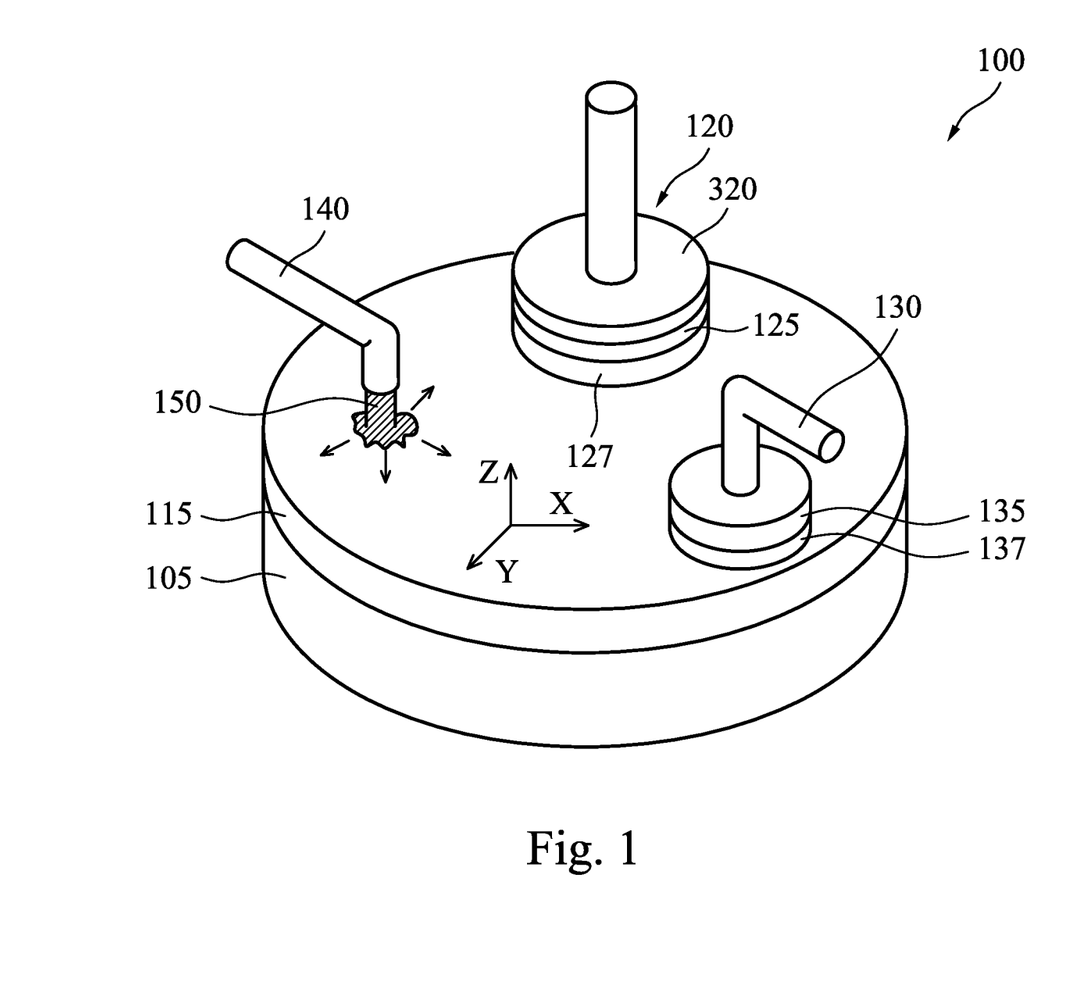
FIG. 1 illustrates a perspective view of a chemical mechanical planarization apparatus, in accordance with an embodiment.

FIG. 1 illustrates a perspective view of a chemical mechanical planarization apparatus 100 in accordance with some embodiments. The chemical mechanical planarization apparatus 100 includes a platen 105 and a polishing pad 115 over (e.g., glued to) the platen 105. In some embodiments, the polishing pad 115 includes a single layer or a composite layer of materials, such as felts, polymer impregnated felts, microporous polymer films, microporous synthetic leathers, filled polymer films, unfilled textured polymer films, combinations thereof, or the like. Representative polymers include polyurethane, polyolefins, or the like.

As illustrated in FIG. 1, a polisher head 120 (may also be referred to as a polishing head) is placed over the polishing pad 115. The polisher head 120 includes a carrier 125, a retainer ring 127, and a megasonic generator 320. The retainer ring 127 and the megasonic generator 320 are mounted to the carrier 125 using mechanical fasteners (e.g., screws, or the like) or other suitable attachment means. In the example of FIG. 1, the retainer ring 127 is attached to a lower side of the carrier 125 and the megasonic generator 320 is attached to an upper side of the carrier 125. The megasonic generator 320 may comprise a piezoelectric transducer (PZT) and is configured to generate vibrations at the carrier 125 and at the polishing pad 115 during the CMP process. More details regarding the megasonic generator 320 are discussed hereinafter.

During a representative chemical mechanical planarization process, a workpiece (e.g., a semiconductor wafer; not shown in FIG. 1 but illustrated and described below with respect to FIG. 3) is placed within the carrier 125 and is held by the retainer ring 127. In some embodiments, the retainer ring 127 has a substantially annular shape with a substantially hollow center. The workpiece is placed in the center of the retainer ring 127 such that the retainer ring 127 holds the workpiece in place during a chemical mechanical planarization process. The workpiece is positioned such that a surface to be polished faces in a direction (for example, downward) towards the polishing pad 115. The carrier 125 is configured to apply downward force or pressure urging the workpiece into contact with the polishing pad 115. The polisher head 120 is configured to rotate the workpiece over the polishing pad 115 during the chemical mechanical planarization process, thereby imparting mechanical abrading action to affect planarization or polishing of a contacting surface of the workpiece.

In some embodiments, the chemical mechanical planarization apparatus 100 includes a slurry dispenser 140 configured to deposit a slurry 150 onto the polishing pad 115. The platen 105 is configured to rotate, causing the slurry 150 to be distributed between the workpiece and the platen 105 through a plurality of grooves in the retainer ring 127. The plurality of grooves may extend from an outer sidewall of the retainer ring 127 to an inner sidewall of the retainer ring 127.

The composition of the slurry 150 may depend on which types of material are to be polished or removed. For example, the slurry 150 may comprise a reactant, an abrasive, a surfactant, and a solvent. The reactant may be a chemical, such as an oxidizer or a hydrolyzer, which chemically reacts with a material of the workpiece in order to assist the polishing pad 115 in abrading or removing material. In some embodiments in which the material to be removed includes, e.g., tungsten, the reactant may be, e.g., hydrogen peroxide, Cr2O7, MnO4, OsO4; although other suitable reactants, such as hydroxylamine, periodic acid, other periodates, iodates, ammonium persulfate, peroxomonosulfates, peroxymonosulfuric acid, perborates, malonamide, combinations of same, or the like, that are configured to aid removal of material may be alternatively, conjunctively, or sequentially employed. In other embodiments, other reactants may be used to remove other types of materials. For example, in embodiments in which a material to be removed includes, e.g., an oxide, the reactant may comprise, e.g., nitric acid ($HNO_3$), potassium hydroxide (KOH), ammonium hydroxide ($NH_4OH$), combinations thereof, or the like.

The abrasive may include any suitable particulate that, in conjunction with the relative mechanical movement of the polishing pad 115, is configured to polish or planarize the workpiece. In some embodiments, the abrasive includes colloidal aluminum oxide. In some embodiments, the abrasive includes silicon oxide, aluminum oxide, cerium oxide, polycrystalline diamond, polymer particles (e.g., polymethacrylate, or the like), combinations thereof, or the like.

The surfactant may be utilized to help disperse the reactant(s) and abrasive(s) within the slurry 150, and to prevent (or otherwise reduce the occurrence of) agglomeration of the abrasive during the chemical mechanical planarization process. In some embodiments, the surfactant may include polyethylene glycol (PEG), polyacrylic acid, sodium salts of polyacrylic acid, potassium oleate, sulfosuccinates, sulfosuccinate derivatives, sulfonated amines, sulfonated amides, sulfates of alcohols, alkylanyl sulfonates, carboxylated alcohols, alkylamino propionic acids, alkyliminodipropionic acids, combinations thereof, or the like. However, such representative embodiments are not intended to be limited to the recited surfactants. Those skilled in the art will appreciate that any suitable surfactant may be alternatively, conjunctively, or sequentially employed.

In some embodiments, the slurry 150 includes a solvent that may be utilized to combine the reactant(s), the abrasive(s), and the surfactant(s), and allow the mixture to be moved and dispersed onto the polishing pad 115. In some embodiments, the solvent includes, e.g., deionized water (DIW), alcohol, or an azeotropic mixture thereof; however, other suitable solvent(s) may be alternatively, conjunctively, or sequentially employed.

Additionally, if desired, other additives may also be added in order to help control or otherwise benefit the CMP process. For example, a corrosion inhibitor may be added in order to help control the corrosion. In one particular embodiment the corrosion inhibitor may be an amino acid such as glycine. However, any suitable corrosion inhibitor may be utilized.

In another embodiment, a chelating agent(s) is added to the slurry 150. The chelating agent may be an agent such as ethylenediaminetetraacetic acid (EDTA), $C_6H_8O_7$, $C_2H_2O_4$, combinations thereof, or the like. However, any suitable chelating agent may be utilized.

In yet another embodiment, the slurry 150 includes a pH adjuster(s) in order to control the pH value of the slurry 150.

For example, a pH adjuster such as HCl, HNO$_3$, H$_3$PO$_4$, C$_2$H$_2$(COOH)$_2$, KOH, NH$_4$OH, combinations thereof, or the like, may be added to the slurry 150 in order to adjust the pH value of the slurry 150 up or down.

Additionally, other additives may also be added to help control and manage the CMP process. For example, down-force enhancers (e.g., an organic compound), polish rate inhibitors, or the like may also be added. Any suitable additives which may be useful to the polishing process may be utilized, and all such additives are fully intended to be included within the scope of the embodiments.

In some embodiments, the chemical mechanical planarization apparatus 100 includes a pad conditioner 137 attached to a pad conditioner head 135. The pad conditioner head 135 is configured to rotate the pad conditioner 137 over the polishing pad 115. The pad conditioner 137 is mounted to the pad conditioner head 135 using mechanical fasteners (e.g., screws, or the like) or by other suitable attachment means. A pad conditioner arm 130 is attached to the pad conditioner head 135, and is configured to move the pad conditioner head 135 and the pad conditioner 137 in a sweeping motion across a region of the polishing pad 115. In some embodiments, the pad conditioner head 135 is mounted to the pad conditioner arm 130 using mechanical fasteners (e.g., screws, or the like) or by other suitable attachment means. The pad conditioner 137 comprises a substrate over which an array of abrasive particles is bonded. The pad conditioner 137 removes built-up wafer debris and excess slurry 150 from the polishing pad 115 during the CMP processing. In some embodiments, the pad conditioner 137 also acts as an abrasive for the polishing pad 115 to renew, or create a desired texture (such as, e.g., grooves, or the like) against which the workpiece may be polished.

As illustrated in FIG. 1, the chemical mechanical planarization apparatus 100 has a single polisher head (e.g., 120) and a single polishing pad (e.g., 115). However, in other embodiments, the chemical mechanical planarization apparatus 100 may have multiple polisher heads or multiple polishing pads. In some embodiments in which the chemical mechanical planarization apparatus 100 has multiple polisher heads and a single polishing pad, multiple workpieces (e.g., semiconductor wafers) may be polished at a same time. In other embodiments in which the chemical mechanical planarization apparatus 100 has a single polisher head and multiple polishing pads, a chemical mechanical planarization process may include a multi-step process. In such embodiments, a first polishing pad may be used for bulk material removal from a wafer, a second polishing pad may be used for global planarization of the wafer, and a third polishing pad may be used, e.g., to buff a surface of the wafer. In some embodiments, different slurry compositions may be used for different stages of chemical mechanical planarization processing. In still other embodiments, a same slurry composition may be used for all chemical mechanical planarization stages.

Figure 2:
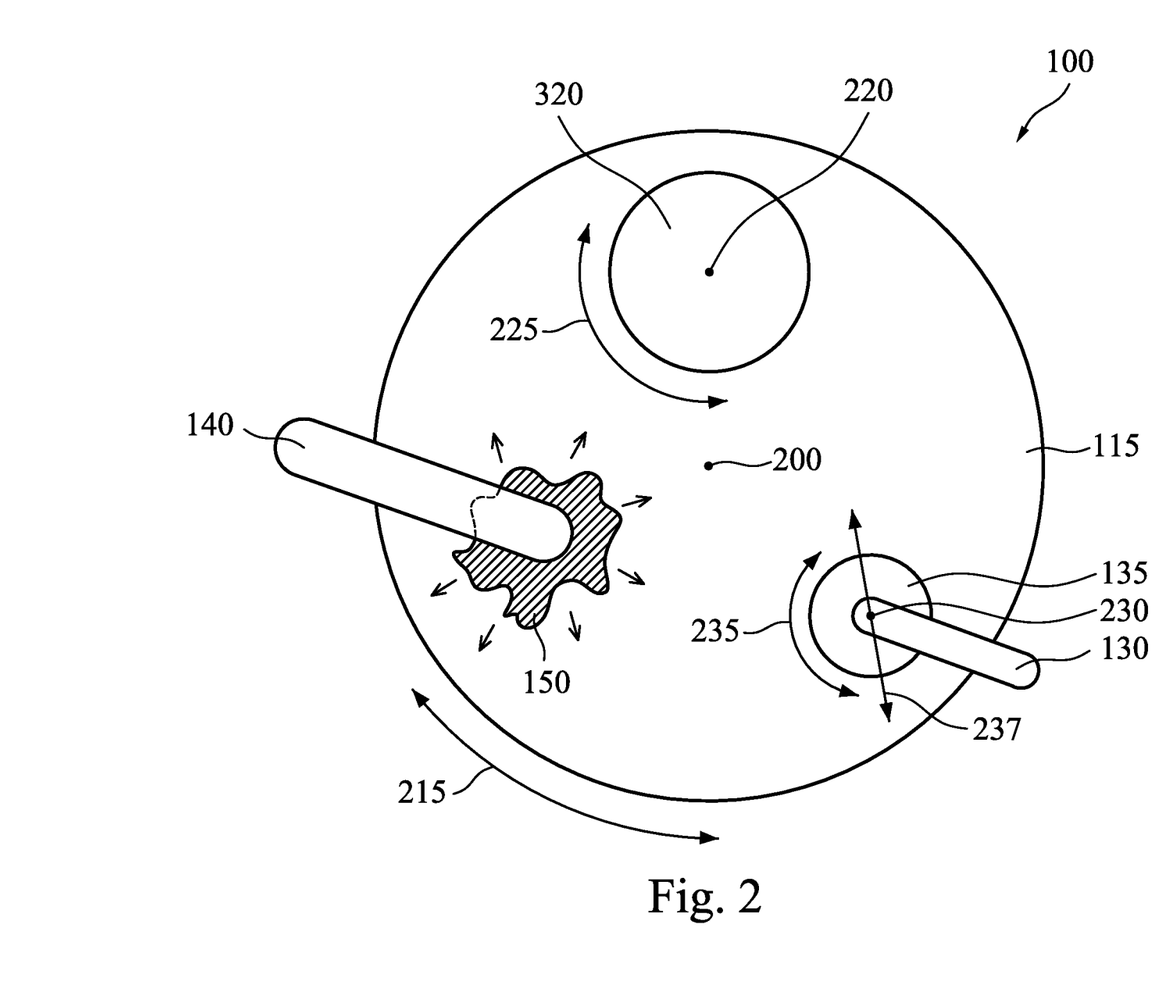
FIG. 2 illustrates a top view of the chemical mechanical planarization apparatus of FIG. 1, in accordance with an embodiment.

FIG. 2 illustrates a top view (or plan view) of the chemical mechanical planarization apparatus 100 of FIG. 1, in accordance with some embodiments. The platen 105 (located beneath the polishing pad 115 in FIG. 2) is configured to rotate in a clockwise or a counter-clockwise direction, indicated by a double-headed arrow 215 around an axis extending through a centrally-disposed point 200, which is a center point of the platen 105. The polisher head 120 is configured to rotate in a clockwise or a counter-clockwise direction, indicated by a double-headed arrow 225 around an axis extending through a point 220, which is a center point of the polisher head 120. The axis through the point 200 is parallel to the axis through the point 220. In the illustrated embodiment, the axis through the point 200 is spaced apart from the axis through the point 220. The pad conditioner head 135 is configured to rotate in a clockwise or a counter-clockwise direction, indicated by a double-headed arrow 235 around an axis extending through a point 230, which is a center point of the pad conditioner head 135. The axis through the point 200 is parallel to the axis through the point 230. The pad conditioner arm 130 is configured to move the pad conditioner head 135 along an arc during rotation of the platen 105, e.g., as indicated by a double-headed arrow 237.

As features size continues to shrink in advanced semiconductor processing nodes, the requirement for planarity of the various layers on the wafer becomes more stringent. In some advanced technology nodes, nanometer sized abrasives are used in the slurry of the CMP process. The size (e.g., diameter) of the nanometer sized abrasives (also referred to as nano-particles, or nano-abrasive particles) may be smaller than about 30 nm, such as between about 3 nm and about 5 nm. A slurry using the nano-abrasive particles is also referred to as a nano-abrasive slurry. In contrast, the size (e.g., diameter) of the abrasives in a conventional slurry may be larger than 35 nm, such as between about 50 nm about 100 nm.

While a CMP process using the nano-abrasive slurry may achieve better planarity, many challenges exist. For example, if a CMP process is performed by simply replacing the conventional slurry with a nano-abrasive slurry, the etch rate (also referred to as removal rate) of the CMP process using the nano-abrasive slurry may be very slow, such as less than about 200 angstroms per minute. Such a slow etch rate may be impractical for use in manufacturing, due to the long CMP processing time required. To compensate for the slow etch rate using the nano-abrasive slurry, conventional CMP process may have to increase the force/pressure (may be referred to as polishing pressure hereinafter for easy of discussion) that is used to press the wafer against the polishing pad 115, or increase the flow rate of slurry used in the CMP process. However, increasing the polishing pressure may increase the risk of wafer damage, such as scratches or cracks in the wafer. Increasing the polishing pressure may also make it difficult for the slurry to flow between the polishing pad 115 and the wafer, which may cause unwanted behaviors for the polishing process. Furthermore, increasing the flow rate of slurry increases the consumption of slurry, which increases the manufacturing cost.

Another challenge for CMP processes using the nano-abrasive slurry is abrasive aggregation, which refers to the issue that abrasives in the slurry are not distributed evenly across the surface of the polishing pad 115 and may aggregate at certain locations, such as in openings 116 (see FIG. 4) at the upper surface of the polishing pad 115.

Figure 4:
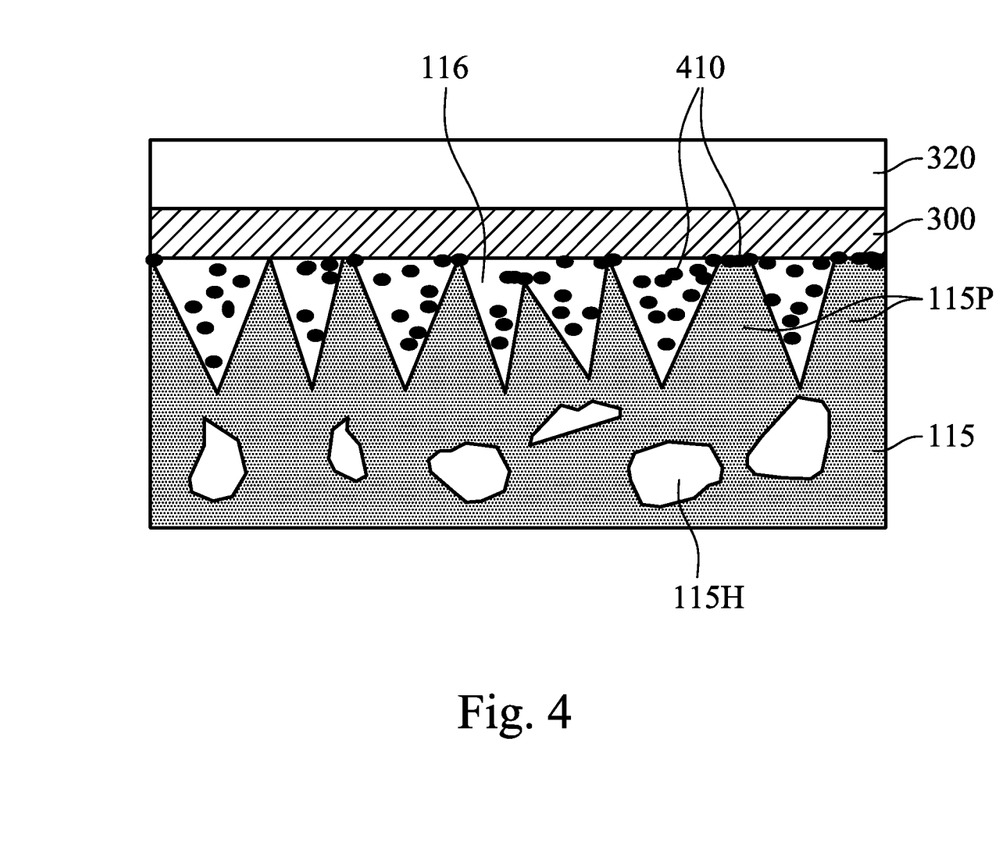
FIG. 4 illustrates a zoomed-in cross-sectional view of the polishing pad, the wafer, and the megasonic generator of the chemical mechanical planarization apparatus of FIG. 1, in accordance with an embodiment.

Referring temporarily to FIG. 4, which shows a cross-sectional view of (portions of) polishing pad 115, wafer 300, and megasonic generator 320. As illustrated in FIG. 4, the polishing pad 115 may be porous and may have cavities 115H therein. The openings 116 may be formed, at least in part, by cavities exposed at the upper surface of the polishing pad 115. FIG. 4 also illustrates the abrasives 410 used in the slurry, which abrasives 410 may aggregate in the openings 116, instead of on the top surfaces of the peaks 115P (e.g., protruding portions at the upper surface) of the polishing pad 115. During the CMP process, the abrasives 410 in the openings 116 may not come into contact with the wafer 300, therefore are ineffective, which lowers the effectiveness of the slurry and results in lowered etch rate of the CMP process. On the other hand, if abrasives 410 are aggregated at certain locations at the top surfaces of the peaks 115P, over-etching of those locations may occur, which may result in local dishing on the surface of the wafer 300. Various embodiments discussed herein prevents or reduces abrasive aggregation by using the megasonic generator 320, thereby achieving improved etch rate and better surface planarity for CMP processes. In addition, the disclosed embodiments allow for lower polishing pressure and lower flow rate for slurry to be used in the CMP process, thereby reducing the risk of wafer damage and lowering the manufacturing cost, details of which are discussed hereinafter.

Figure 3:
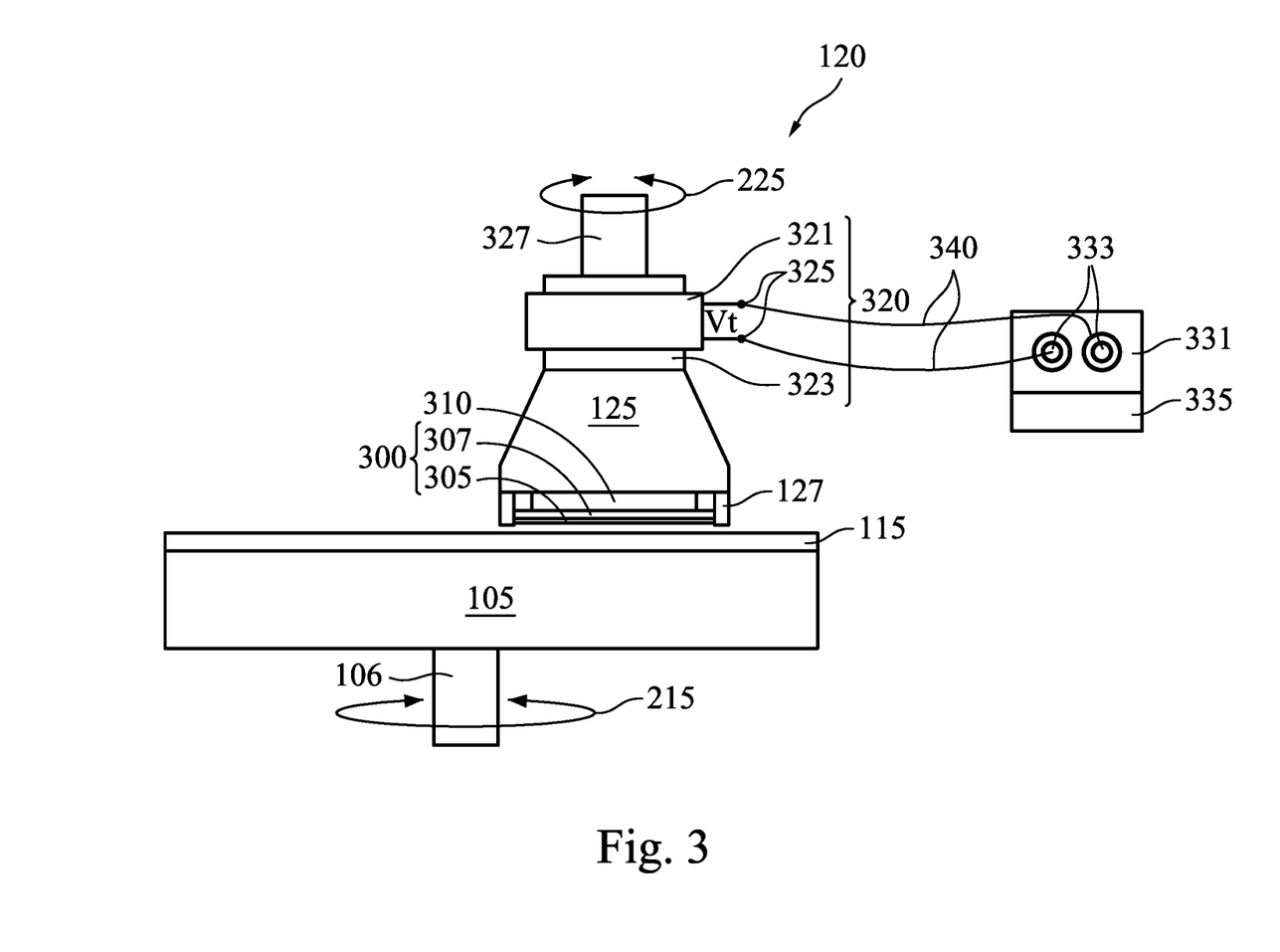
FIG. 3 illustrates a cross-sectional view of the chemical mechanical planarization apparatus of FIG. 1, in accordance with an embodiment.

Referring now to FIG. 3, which illustrates a cross-sectional view of the chemical mechanical planarization apparatus 100 of FIG. 1, in accordance with an embodiment. Note that for clarity, not all features of the chemical mechanical planarization apparatus 100 are illustrated in FIG. 3. As illustrated in FIG. 3, the platen 105, with the polishing pad 115 attached on top, rotates around an axis 106. The polisher head 120 includes the carrier 125, the retainer ring 127, and the megasonic generator 320, and rotates around an axis 327. The platen 105 and the polisher head 120 may rotation in a same direction, or in opposite directions.

In the example of FIG. 3, the carrier 125 includes a membrane 310 configured to interface with a wafer 300 during the CMP process. In some embodiments, the chemical mechanical planarization apparatus 100 includes a vacuum system coupled to the polisher head 120, and the membrane 310 is configured to pick up and hold the wafer 300 onto the membrane 310 using, e.g., vacuum suction. The membrane 310 may form an enclosed space by itself or with a lower side of the carrier 125. During the CMP process, a pressure (may also be referred to as an interior pressure of the membrane) within the enclosed space may be maintained at a pre-determined level, such that the inflated membrane 310 pushes the wafer 300 down toward the polishing pad 115. By adjusting the interior pressure of the membrane 310, the polishing pressure may be adjusted.

Still referring to FIG. 3, the megasonic generator 320 includes a holder 321, electrical terminals 325, and a piezoelectric transducer (PZT) 323. The holder 321 may be used to hold the PZT 323 and to attach the megasonic generator 320 to the axis 327. The holder 321 may also include circuits that electrically couple the electrical terminals 325 with the PZT 323. A control voltage Vt, which is used to control the operations of the PZT 323 to generate vibrations, is applied to the electrical terminals 325 by a power supply 331. The power supply 331 may include a controllable voltage source and a power amplifier to generate the control voltage Vt at output terminals 333. The control voltage at the output terminals 333 of the power supply 331 is then supplied to the electrical terminals 325 by conductive lines 340 (e.g., copper lines). In some embodiments, the conductive lines 340 are routed through the interior of the axis 327 (which may be hollow) to connect with the power supply 331.

FIG. 3 further illustrates a controller 335 electrically coupled to the power supply 331. The controller 335 may instruct and control the power supply 331 to generate control voltages with different parameters to generate different vibration patterns by the PZT 323, details of which are discussed below with reference to FIGS. 5-7. In some embodiments, the power supply 331 and the controller 335 are external to, thus not a part of, the megasonic generator 320. In some embodiments, the power supply 331 and the controller 335 are integrated into the megasonic generator 320, thus are part of the megasonic generator 320.

As illustrated in FIG. 3, the PZT 323 is attached to the carrier 125. When the control voltage Vt is applied to the PZT 323 during the CMP process, movement of the PZT 323 generates vibrations which, through physical contact or other transmission media (e.g., slurry), are transmitted to, e.g., the carrier 125, the retainer ring 127, and the polishing pad 115. The vibrations generated by the megasonic generator 320 may be along a first direction within a plane parallel to the upper surface of the polishing pad 115 (e.g., a plane defined by the x-axis and the y-axis in FIG. 1), along a second direction (e.g., along the z-axis in FIG. 1) perpendicular to the upper surface of the polishing pad 115, or along both the first direction and the second direction. Although the megasonic generator 320 is illustrated in FIG. 3 as being mounted on the carrier 125 and rotating around the axis 327, other configurations or locations for the megasonic generator 320 are possible and are fully intended to be included within the scope of the present disclosure. For example, the megasonic generator 320 may be mounted at the lower surface of the platen 105, and may rotate around the axis 106.

In some embodiments, the wafer 300 is a semiconductor wafer comprising, for example, a semiconductor substrate (e.g., comprising silicon, a III-V semiconductor material, or the like), active devices (e.g., transistors, or the like) formed in or on the semiconductor substrate, and various interconnect structures. Representative interconnect structures may include conductive features, which electrically connect the active devices to form functional circuits. In various embodiments, the CMP process may be applied to the wafer 300 during any stage of manufacture in order to planarize features or otherwise remove material (e.g., dielectric material, semiconductor material, conductive material, or the like) of the wafer 300. The wafer 300 may include any subset of the above-identified features, as well as other features.

As illustrated in FIG. 3, the wafer 300 comprises bottommost layer(s) 305 and overlying layer(s) 307. The bottommost layer 305 is subjected to polishing/planarization during a CMP process. In some embodiments, the bottommost layer 305 comprises metal, such as tungsten, copper, cobalt, titanium, ruthenium, combinations thereof, or the like. In some embodiments, the bottommost layer 305 comprises a dielectric material, such as silicon oxide, silicon nitride, combinations thereof, or the like. In some embodiments, the bottommost layer 305 comprises a semiconductor material, such as silicon, polysilicon, silicon germanium, silicon carbide, the combinations thereof, or the like. The bottommost layer 305 may be polished to form, e.g., contact plugs contacting various active devices of the wafer 300. In embodiments in which the bottommost layer 305 comprises copper, the bottommost layer 305 may be polished to form, e.g., various interconnect structures of the wafer 300. In embodiments in which the bottommost layer 305 comprises a dielectric material, the bottommost layer 305 may be polished to form, e.g., shallow trench isolation (STI) structures on the wafer 300.

In some embodiments, the bottommost layer 305 may have a non-uniform thickness (e.g., exhibiting local or global topological variation of an exposed surface of the bottommost layer 305) resulting from process variations experienced during deposition of the bottommost layer 305. For example, in an embodiment in which the bottommost layer 305 being planarized comprises tungsten, the bottommost layer 305 may be formed by depositing tungsten into an opening through a dielectric layer using a chemical vapor deposition (CVD) process. Due to CVD process variations or other underlying structures, the bottommost layer 305 may have a non-uniform thickness.

In some embodiments, a thickness profile of the bottommost layer 305 may be measured using ellipsometry, interferometry, reflectometry, picosecond ultrasonics, atomic force microscopy (AFM), scanning tunneling microscopy (STM), scanning electron microscopy (SEM), transmission electron microscopy (TEM), or the like. In some embodiments, a thickness measurement apparatus (not shown) may be external to the chemical mechanical planarization apparatus 100, and a thickness profile of the bottommost layer 305 may be measured or otherwise determined before loading the wafer 300 into the chemical mechanical planarization apparatus 100. In other embodiments, a thickness measurement apparatus may be a part of the chemical mechanical planarization apparatus 100, and a thickness profile of the bottommost layer 305 may be measured or otherwise determined after loading the wafer 300 into the chemical mechanical planarization apparatus 100.

After measurement, the bottommost layer 305 may be planarized by the chemical mechanical planarization apparatus 100. In a particular embodiment the polisher head 120 may be lowered such that the bottommost layer 305 of the wafer 300 is in physical contact with the polishing pad 115. Additionally, the slurry 150 is also introduced onto the polishing pad 115, such that the slurry 150 will come into contact with the exposed surfaces of the bottommost layer 305. For example, the slurry 150 may be introduced at a flow rate of between about 100 cubic centimeters per minute (cc/min) and about 500 cc/min, such as about 250 cc/min. The surface (e.g., the bottommost layer 305) of the wafer 300 may thus be planarized using a combination of both mechanical and chemical forces.

Referring now to FIG. 4, which illustrates a zoomed-in cross-sectional view of a portion of the polishing pad 115, a portion of the wafer 300, and a portion of the megasonic generator 320. During the CMP process, the vibrations generated by the megasonic generator 320 helps to distribute the abrasives 410 evenly across the upper surface of the polishing pad 115. For example, some of the abrasives 410 aggregated at the bottom of the openings 116 (e.g., between adjacent peaks 115P) may be stirred up by the vibrations and get distributed to the top surfaces of the peaks 115P (e.g., between the peaks 115P and the wafer 300), thus becoming effective abrasives 410 that participate in the polishing process. As a result, the etch rate of the CMP process may reach, e.g., 3000 angstroms per minute or larger for an oxide film, which may be 10% to 20% better than a CMP process without using the megasonic generator 320. The even distribution of the abrasives 410 also reduces the local dishing effect, thus achieving a better planarity for the polished wafer surface.

In some embodiments, a frequency of the vibration generated by the megasonic generator 320, which may be the same as, or proportional to, the frequency of the control voltage Vt, is between about 10 KHz and about 50 KHz. A vibration frequency smaller than 10 KHz may be too low and not effective for reducing abrasive aggregation. A vibration frequency larger than 50 KHz, however, may be too high and may damage the wafer 300 (e.g., may damage the surface of the wafer 300).

In some embodiments, a rotational speed of the platen 105 is between about 30 rounds per minute (rpm) and about 120 rpm, and a rotational speed of the polisher head 120 is between about 30 rpm and about 120 rpm. If the rotational speeds of the platen 105 and the polisher head 120 are below about 30 rpm, the rotational speeds may be too low, and the effect of the vibrations may be limited to local regions of the wafer surface for too long, and may cause uneven etch rates in different local regions of the wafer surface. For example, the abrasive 410 may be stirred up from the bottom of the openings 116 but may not be distributed to other regions quickly enough, which may create localized surface regions with higher concentrations of abrasives than other localized surface regions with less openings 116. Therefore, the etch rate at different localized regions may be different and may cause the uneven etch rates. On the other hand, if the rotational speeds of the platen 105 and the polisher head 120 are above about 120 rpm, the effectiveness of the slurry may decrease. This may be due to fresh slurry being spread out too quickly over the pad surface, which may result in a very thin layer of fresh slurry, thereby reducing the etch rate of the CMP process.

In some embodiments, the porosity of the polishing pad 115 is between about 10% and about 80%, such as between about 30% and about 60%, or between about 40% and about 50%. For polishing pad 115 with lower porosity (e.g., <10%), the benefit of the megasonic generator 320 may not be significant enough to justify the cost of the megasonic generator 320, since there is very little abrasive aggregation in the openings 116. If the porosity is too high (e.g., >80%), the effectiveness of the megasonic generator 320 may be limited. This is because with high concentrations of openings 116 at the upper surface of the polishing pad 115, the total area of the top surfaces of the peaks 115P, where the effective abrasives 410 rest during the CMP process, is too limited. In other words, an ineffective abrasive particle 410, stirred up from the bottom of an opening 116 by the vibrations, may likely fall back into another opening 116, thus remains an ineffective abrasive particle.

Due to the improved etch rate achieved by the disclosed embodiment, the flow rate of the slurry and the polishing pressure do not need to be increased. In some embodiments, the flow rate of the slurry is between about 100 cc/min and about 500 cc/min, such as about 250 cc/min. The low flow rate of slurry allowed for by the present disclosure reduces manufacturing cost associated with the consumption of slurry. In some embodiments, due to the low polishing pressure allowed for by the present disclosure, the interior pressure of the membrane 310 may be set between about 0.5 psi and about 3 psi during the CMP process, which is lower than a range between about 1 psi and about 5 psi used for a conventional CMP process without the megasonic generator 320. The lower polishing pressure reduces wafer damage. In addition, the use of megasonic generator 320 in the CMP process also achieves better surface planarity than the conventional CMP process. For example, the topography (e.g., unevenness) of the polished wafer surface using the disclosed embodiments is about 10% to about 50% of the topography of the polished wafer surface using the conventional CMP process.

Figure 5:
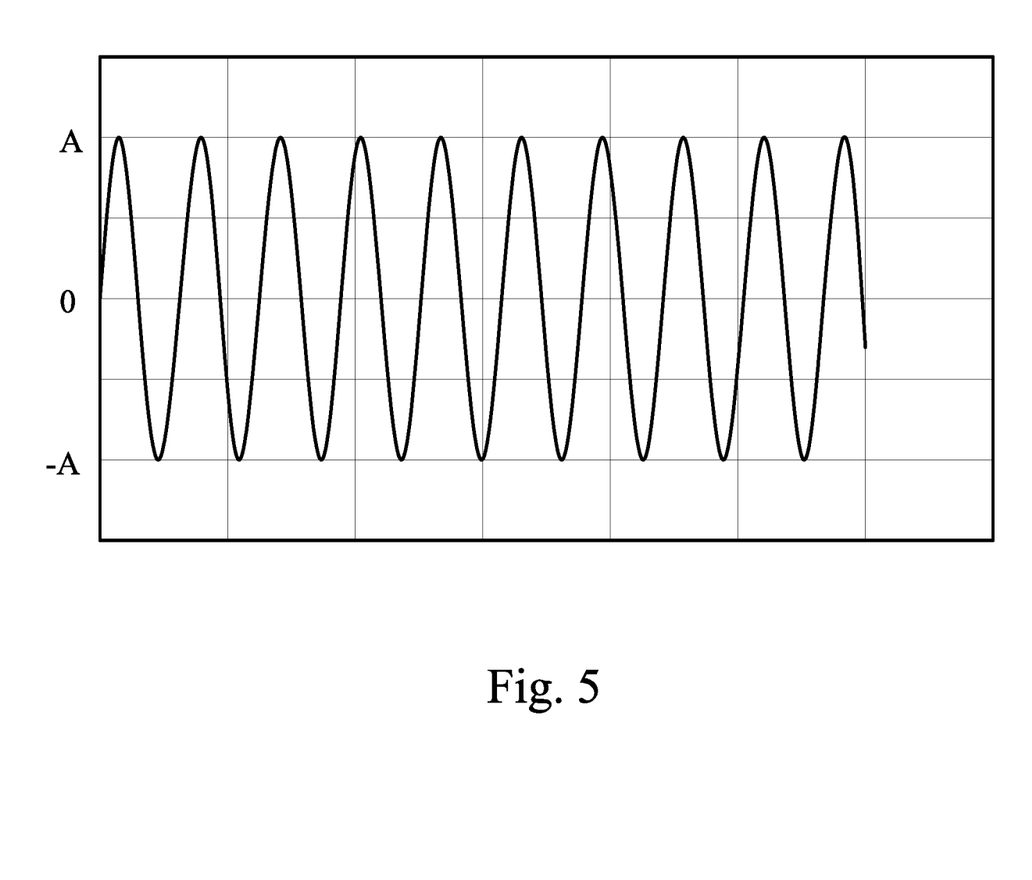
FIG. 5 illustrates a control voltage supplied to the megasonic generator of the chemical mechanical planarization apparatus of FIG. 1, in accordance with an embodiment.

FIG. 5 illustrates a control voltage supplied to the megasonic generator 320, in an embodiment. The x-axis of FIG. 5 illustrates time, and the y-axis illustrates amplitude. The control voltage of FIG. 5 is a continuous wave (e.g., a sine wave, or a cosine wave) signal with a pre-determined frequency between, e.g., about 10 KHz and about 50 KHz. The frequency of the control voltage is the same as, or proportional to, the vibration frequency of the megasonic generator 320, in the illustrated embodiment. In some embodiments, the frequency of the control voltage is adjusted to achieve a target polished surface profile after the CMP process. Recall that the thickness profile of the bottommost layer 305 of the wafer 300 may be measured before the CMP process. The measured thickness profile of the bottommost layer 305 may be used to determine, e.g., the frequency of the control voltage for the megasonic generator 320. In some embodiments, the amplitude of the control voltage is adjusted to achieve a target polished surface profile after the CMP process. In some embodiments, both the frequency and the amplitude of the control voltage are adjusted to achieve a target polished surface profile after the CMP process.

Figure 6:
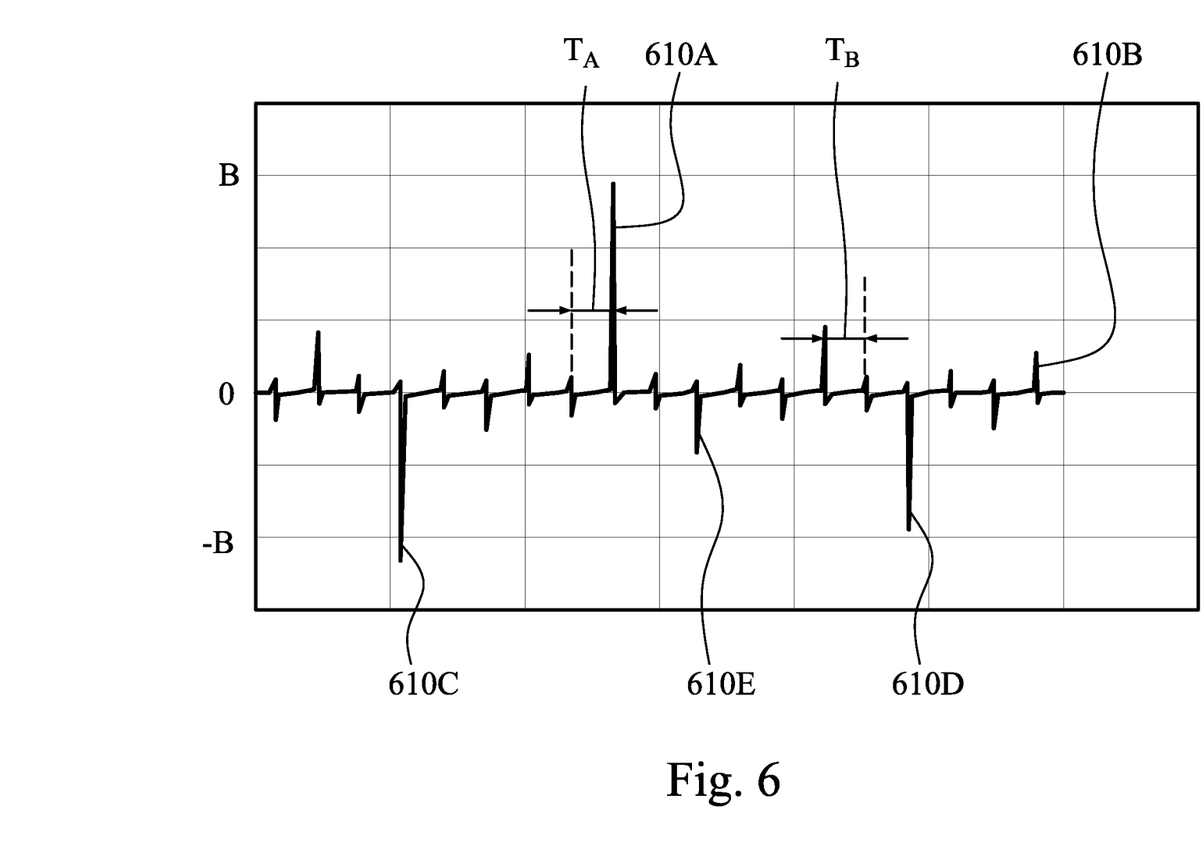
FIG. 6 illustrates a control voltage supplied to the megasonic generator of the chemical mechanical planarization apparatus of FIG. 1, in accordance with another embodiment.

FIG. 6 illustrates a control voltage supplied to the megasonic generator 320, in another embodiment. The x-axis of FIG. 6 illustrates time, and the y-axis illustrates amplitude. The control voltage in FIG. 6 comprises bursts of control voltage, e.g., 610A, 610B, where each burst of control voltage includes one or more cycles (e.g., periods) of a continuous-wave control voltage same as or similar to the control voltage of FIG. 5. For example, each burst of control voltage may have a duration between about 1 ms to about 300 ms. In some embodiments, each burst of control voltage has a first frequency, and generates vibrations with a second frequency at the megasonic generator 320, where the second frequency is the same as or proportional to the first frequency.

In the example of FIG. 6, the amplitude, the frequency, and/or the duration of each burst of control voltage (e.g., 610A, or 610B) may be adjusted individually to achieve a target polished surface profile, thus different from the amplitude, the frequency, and/or the duration of another burst of control voltage. As illustrated in FIG. 6, each burst of control voltage is separated from an adjacent burst of control voltage by a period of silence (e.g., a period of time with no control voltage or zero control voltage, which corresponds to no vibration being generated at the megasonic generator 320). In some embodiments, the durations (see, e.g., $T_A$ and $T_B$ in FIG. 6) between adjacent bursts of control voltages may be adjusted individually, and therefore, are different from each other. In the example of FIG. 6, the control voltages may include bursts of control voltage with large amplitudes (e.g., 610A, 610C, 610D), and bursts of control voltages with smaller amplitudes (e.g., 610B, 610E) that are interspersed between the bursts of control voltage with large amplitudes. Each of the bursts of control voltage with large amplitudes (e.g., 610A, 610C, or 610D) may have an offset (e.g., a non-zero mean value) in its amplitude, and therefore, may include one or more cycles of a continuous-wave control voltage oscillating around the non-zero mean value. For example, the control voltage 610A has a positive offset, and the control voltage 610C has a negative offset. In addition, the bursts of control voltage with large amplitudes (e.g., 610A, 610C, or 610D) may have alternating signs (e.g., positive or negative) for their offsets, in some embodiments. Each of the bursts of control voltages with smaller amplitudes (e.g., 610B, 610E) in FIG. 6 may have a zero mean value, or may have a small positive offset or a small negative offset that is less than, e.g., 10% of the offset of the large control voltages (e.g., 610A, 610C, 610D). The patterns of the control voltages illustrated in FIG. 6 are merely non-limiting examples, other patterns are also possible and are fully intended to be included within the scope of the present disclosure.

The control voltage illustrated in FIG. 6 allows for many degrees of freedom in fine tuning the CMP process to achieve a target polished surface profile. One skilled in the art will appreciate that while the discussion above describes each burst of control voltage as being adjusted individually, the embodiment where some, or all, of the bursts of control voltage share the same parameters (e.g., amplitude, frequency, duration of each burst of control voltage, and/or duration between adjacent bursts of control voltage) are fully intended to be included within the scope of the present disclosure.

Figure 7:
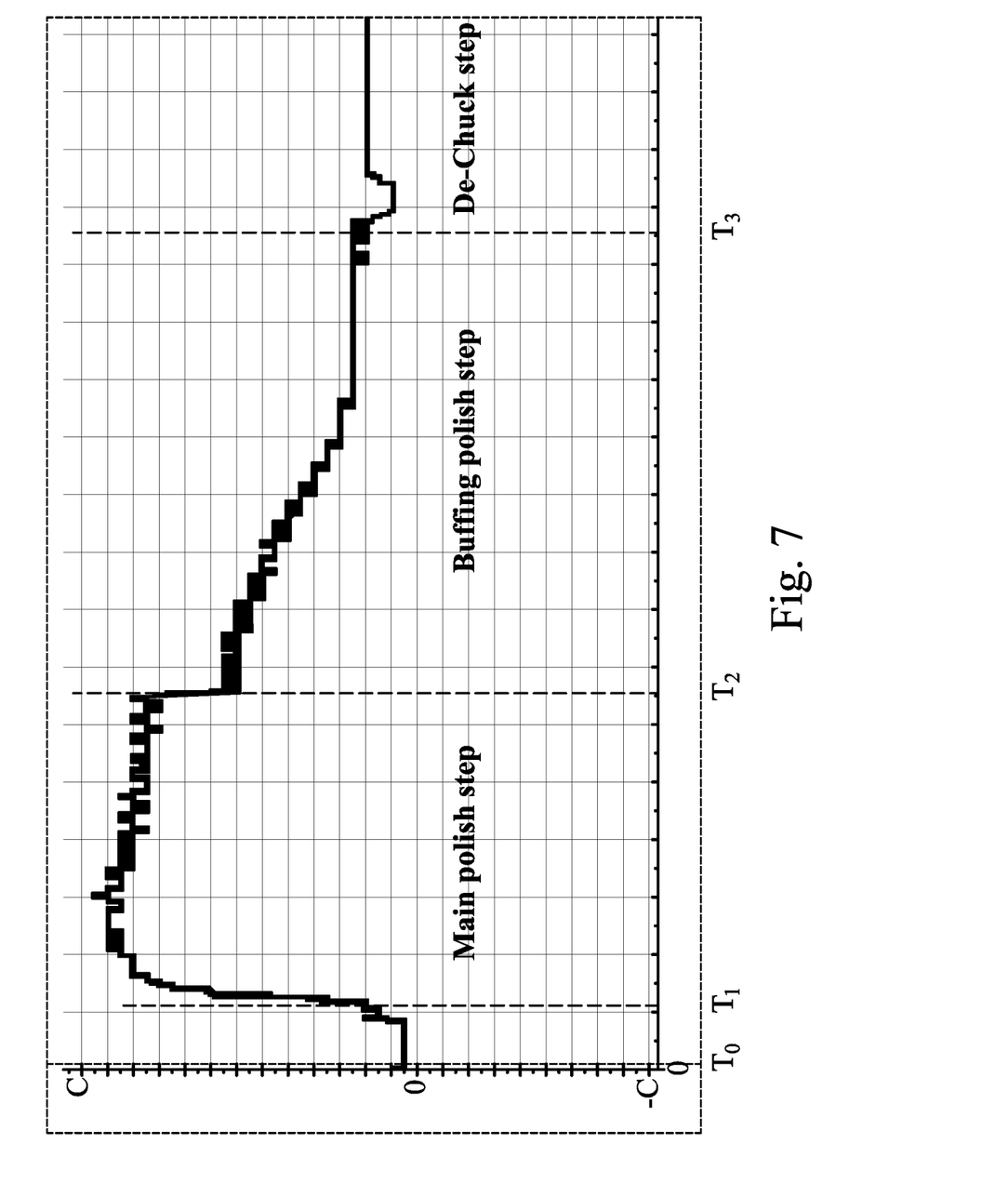
FIG. 7 illustrates a control voltage supplied to the megasonic generator of the chemical mechanical planarization apparatus of FIG. 1, in accordance with yet another embodiment.

FIG. 7 illustrates another embodiment control voltage, where the control voltage is changed dynamically at different stages of a CMP process. The x-axis of FIG. 7 illustrates time, and the y-axis illustrates frequency. In the illustrated embodiment, the frequency of the control voltage is the same as or proportional to the vibration frequency at the megasonic generator 320. In FIG. 7, between time T0 and T1, the CMP process is in the ramp-up stage, and the frequency of the control voltage is ramped up in preparation for entering the main polish stage of the CMP process. Between time T1 and time T2, the CMP process is in the main polish stage, where a first control voltage frequency (e.g., between about 20 KHz and about 26 KHz) is used to polish the wafer at a relatively high etch rate. Between time T2 and time T3, the CMP process enters the buffing polish step, where a second control voltage frequency (e.g., between about 5 KHz and about 15 KHz) smaller than the first control voltage frequency is used to buff the wafer at a slower etch rate. After time T3, the CMP process enters the de-chuck stage, where the wafer is getting ready to be removed from the retainer ring 127. A third control voltage frequency (e.g., smaller than 4 KHz), which may be smaller than the second control voltage frequency, is used during the de-chuck stage. The example of FIG. 7 further illustrates a temporary decrease in the third control voltage frequency after time T3 for, e.g., about 3 to 5 seconds, before the third control voltage frequency settles at about 4 KHz. The temporary decrease (e.g., with a control voltage frequency at about 2 KHz) may be implemented to accommodate the polishing head, which may be unstable at the beginning of the de-chuck stage.

Embodiment may achieve advantages. For example, the megasonic generator reduces abrasive aggregation and helps to evenly distribute the abrasives along the surface of the polishing pads, thereby improving the etch rate of the CMP process and achieving a better planarity for the polished wafer surface. The disclosed CMP tool allows a low polishing pressure (e.g., between about 0.5 psi and about 3 psi) to be applied to the wafer, thereby reducing risks of wafer damage related to large polishing pressure. The flow rate of the slurry used in the CMP process may be kept low compared with a conventional CMP process, which saves manufacturing cost associated with slurry consumption. Although the present disclosure is discussed using the example of nano-abrasive slurry, the disclosed embodiments may be applied to CMP processes using abrasives having other sizes, such as having diameters between 2 nm and about 300 nm.

Figure 8:
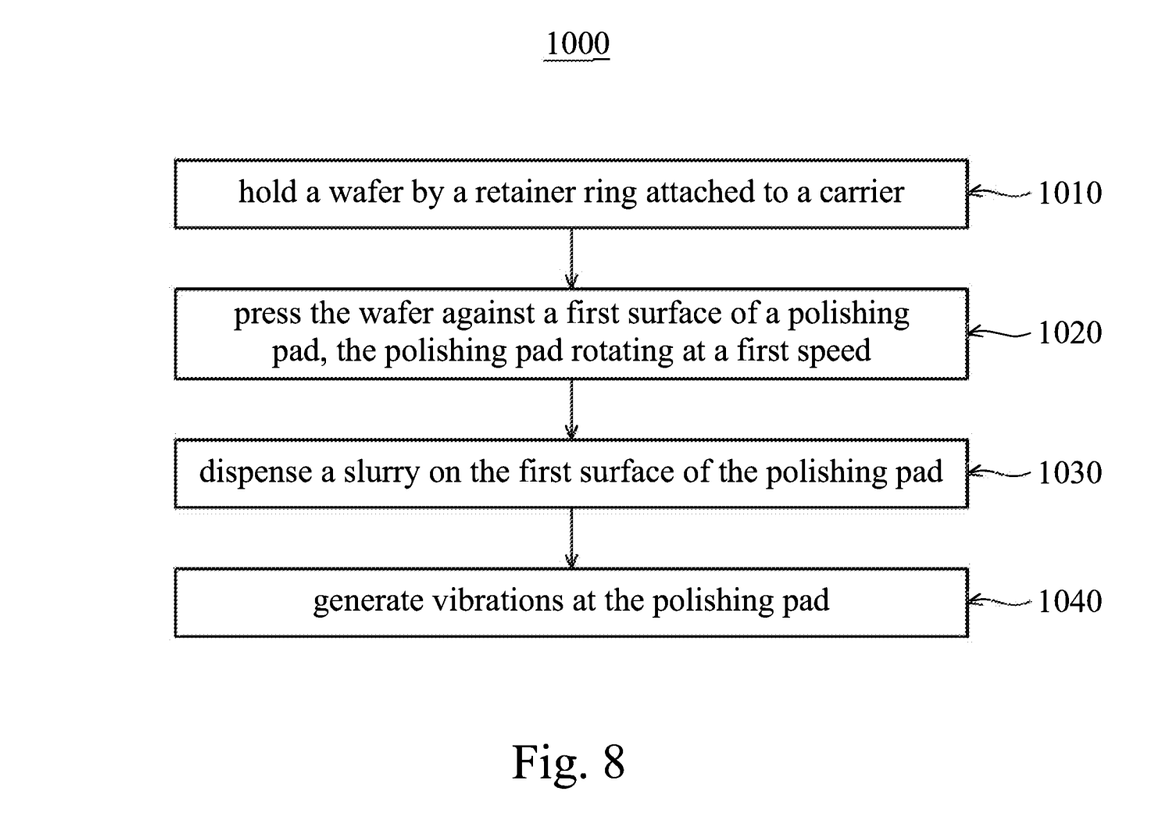
FIG. 8 illustrates a flow chart for a method of performing a chemical mechanical planarization process, in accordance with some embodiments.

FIG. 8 illustrates a flow chart for a method 1000 of performing a chemical mechanical planarization process, in accordance with some embodiments. It should be understood that the embodiment method shown in FIG. 8 is merely an example of many possible embodiment methods. One of ordinary skill in the art would recognize many variations, alternatives, and modifications. For example, various steps as illustrated in FIG. 8 may be added, removed, replaced, rearranged and repeated.

Referring to FIG. 8, at step 1010, a wafer is held by a retainer ring attached to a carrier. At step 1020, the wafer is pressed against a first surface of a polishing pad, the polishing pad rotating at a first speed. At step 1030, a slurry is dispensed on the first surface of the polishing pad. At step 1040, vibrations are generated at the polishing pad.

In accordance with an embodiment, a chemical mechanical planarization (CMP) tool includes a carrier; a retainer ring attached to the carrier and configured to hold a wafer during a CMP process; and a megasonic generator attached to the carrier and configured to generate vibrations during the CMP process. In an embodiment, the megasonic generator comprises a piezoelectric transducer. In an embodiment, the megasonic generator is configured to generate the vibrations having a frequency between about 10 KHz and about 50 KHz. In an embodiment, the megasonic generator is configured to generate the vibrations along directions within a plane parallel to a major surface of the wafer, or along a direction perpendicular to the major surface of the wafer. In an embodiment, the CMP further includes a platen; and a polishing pad attached to an upper surface of the platen, where the carrier is configured to press the wafer against the polishing pad during the CMP process. In an embodiment, a porosity of the polishing pad is between about 10% and about 80%. In an embodiment, the CMP tool further includes a slurry dispenser, where the slurry dispenser is configured to dispense a slurry on the polishing pad during the CMP process, where a diameter of abrasives in the slurry is smaller than about 30 nm.

In accordance with an embodiment, a method of performing a chemical mechanical planarization (CMP) process includes rotating a polishing pad at a first rotational speed; dispensing a slurry on a first surface of the polishing pad; pressing a wafer against the first surface of the polishing pad, the wafer being held by a retaining ring of a carrier; and generating vibrations at the polishing pad during the CMP process using a megasonic generator. In an embodiment, the first rotational speed is between about 30 round per minute (rpm) and about 120 rpm, where the method further comprises rotating the wafer at a second rotational speed between about 30 rpm and about 120 rpm. In an embodiment, generating vibrations comprises generating vibrations having a frequency between about 10 KHz and about 50 KHz using the megasonic generator. In an embodiment, a porosity of the polishing pad is between about 10% and about 80%. In an embodiment, a diameter of abrasives in the slurry is smaller than about 30 nm. In an embodiment, dispensing the slurry comprises dispensing the slurry on the first surface of the polishing pad during the CMP process at a flow rate between about 0.1 liter per minute and about 0.5 liter per minute. In an embodiment, the carrier comprises a membrane that is in contact with the wafer during the CMP process, where pressing the wafer comprises inflating the membrane at a pre-determined pressure level to press the wafer against the first surface of the polishing pad, the pre-determined pressure level being between about 0.5 pound per square inch (psi) and about 3 psi. In an embodiment, generating vibrations comprises: generating the vibrations at a first vibration frequency during a main polish step of the CMP process; generating the vibrations at a second vibration frequency smaller than the first vibration frequency during a buffing polish step of the CMP process; and generating the vibrations at a third vibration frequency smaller than the second vibration frequency during a de-chuck step of the CMP process. In an embodiment, generating the vibrations comprises generating a first burst of vibrations and a second burst of vibrations separated from the first burst of vibrations by a period of time with no vibration, where a first amplitude of the first burst of vibrations is different from a second amplitude of the second burst of vibrations.

In accordance with an embodiment, a method of performing a chemical mechanical planarization (CMP) process includes holding a wafer by a retainer ring attached to a carrier; pressing the wafer against a first surface of a polishing pad, the polishing pad rotating at a first speed; dispensing a slurry on the first surface of the polishing pad; and generating vibrations at the polishing pad. In an embodiment, generating the vibrations comprises generating the vibrations with a vibration frequency between about 10 KHz and about 50 KHz using a megasonic generator attached to the carrier, the megasonic generator comprising a piezoelectric transducer. In an embodiment, the first speed is between about 30 round per minute (rpm) and about 120 rpm, and the method further comprises rotating the carrier at a second speed between about 30 rpm and about 120 rpm. In an embodiment, generating the vibrations comprises generating the vibrations with a first vibration frequency during a first stage of the CMP process, and generating the vibrations with a second vibration frequency different from the first vibration frequency during a second stage of the CMP process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chemical mechanical planarization (CMP) tool comprising:
    a carrier;
    a retainer ring attached to the carrier and configured to hold a wafer during a CMP process; and
    a megasonic generator attached to the carrier and configured to generate vibrations during the CMP process, wherein the megasonic generator is configured to, during the CMP process, generate a first burst of vibrations and a second burst of vibrations, wherein the second burst of vibrations is separated from the first burst of vibrations by a period of time, wherein an amplitude of the first burst of vibrations or a frequency of the first burst of vibration is different from that of the second burst of vibrations.

2. The CMP tool of claim 1, wherein no vibration is generated by the megasonic generator during the period of time between the first burst of vibrations and the second burst of vibrations.

3. The CMP tool of claim 2, wherein the megasonic generator comprises a piezoelectric transducer.

4. The CMP tool of claim 3, further comprising:
    a power supply coupled to the piezoelectric transducer and configured to provide a control voltage to the piezoelectric transducer; and
    a controller coupled to the power supply and configured to instruct the power supply to generate the control voltage, wherein the control voltage is a time-varying voltage.

5. The CMP tool of claim 1, wherein the megasonic generator is configured to generate the vibrations having a frequency between about 10 KHz and about 50 KHz.

6. The CMP tool of claim 1, further comprising:
a platen; and
a polishing pad attached to the platen, wherein the carrier is configured to press the wafer against the polishing pad during the CMP process.

7. The CMP tool of claim 6, further comprising a slurry dispenser, wherein the slurry dispenser is configured to dispense a slurry on the polishing pad during the CMP process.

8. The CMP tool of claim 7, wherein a porosity of the polishing pad is between about 10% and about 80%, wherein a diameter of abrasives in the slurry is smaller than about 30 nm.

9. A chemical mechanical planarization (CMP) tool comprising:
a polishing pad;
a slurry dispenser configured to dispense a slurry on the polishing pad during a CMP process of the CMP tool; and
a polishing head configured to rotate around a center axis of the polishing head during the CMP process, comprising:
a carrier;
a retainer ring attached to the carrier and configured to hold a wafer during the CMP process; and
a megasonic generator attached to the carrier and configured to generate vibrations at the polishing pad during the CMP process, wherein the megasonic generator is configured to generate a first burst of vibrations and a second burst of vibrations separated from the first burst of vibrations by a period of time with no vibration.

10. The CMP tool of claim 9, wherein a first amplitude of the first burst of vibrations is different from a second amplitude of the second burst of vibrations.

11. The CMP tool of claim 9, wherein a first frequency of the first burst of vibrations is different from a second frequency of the second burst of vibrations.

12. The CMP tool of claim 9, wherein the megasonic generator is configured to generate the vibrations along directions within a plane parallel to a major surface of the wafer, or along a direction perpendicular to the major surface of the wafer.

13. The CMP tool of claim 9, wherein a frequency of the vibrations is between about 10 KHz and about 50 KHz.

14. The CMP tool of claim 9, wherein the slurry dispenser is configured to dispense the slurry on the polishing pad during the CMP process at a flow rate between about 0.1 liter per minute and about 0.5 liter per minute, wherein a diameter of abrasives in the slurry is smaller than about 30 nm.

15. The CMP tool of claim 14, wherein the carrier comprises a membrane that is in contact with the wafer during the CMP process, wherein during the CMP process, the membrane is configured to be inflated at a pre-determined pressure level to press the wafer against the polishing pad, wherein the pre-determined pressure level is between about 0.5 pound per square inch (psi) and about 3 psi.

16. The CMP tool of claim 9, wherein the polishing pad is configured to rotate at a first rotational speed between about 30 round per minute (rpm) and about 120 rpm during the CMP process, wherein polishing head is configured to rotate at a second rotational speed between about 30 rpm and about 120 rpm during the CMP process.

17. A method of performing a chemical mechanical planarization (CMP) process, the method comprising:
rotating a polishing pad;
dispensing a slurry on a first surface of the polishing pad;
pressing a wafer against the first surface of the polishing pad; and
generating vibrations at the polishing pad during the CMP process using a megasonic generator, comprising:
generating the vibrations at a first vibration frequency during a main polish step of the CMP process;
generating the vibrations at a second vibration frequency smaller than the first vibration frequency during a buffing polish step of the CMP process; and
generating the vibrations at a third vibration frequency smaller than the second vibration frequency during a de-chuck step of the CMP process.

18. The method of claim 17, wherein the buffing polish step is between the main polish step and the de-chuck step.

19. The method of claim 18, further comprising, after the buffing polish step and before the de-chuck step, generating the vibrations at a fourth vibration frequency smaller than the third vibration frequency for a pre-determined period of time.

20. The method of claim 17, wherein generating vibrations at the polishing pad comprises generating vibrations that include bursts of vibrations separated by periods of no vibration in-between.

* * * * *